(12) United States Patent
Murakami

(10) Patent No.: US 10,347,518 B2
(45) Date of Patent: Jul. 9, 2019

(54) TRANSPORT VEHICLE

(71) Applicant: Daifuku Co., Ltd., Osaka-shi (JP)

(72) Inventor: Ryuya Murakami, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/794,046

(22) Filed: Oct. 26, 2017

(65) Prior Publication Data

US 2018/0122656 A1  May 3, 2018

(30) Foreign Application Priority Data

Oct. 31, 2016 (JP) .................. 2016-213246

(51) Int. Cl.
| | | |
|---|---|---|
| *H01L 21/677* | (2006.01) | |
| *B66C 1/28* | (2006.01) | |
| *B66C 1/66* | (2006.01) | |
| *B66C 13/23* | (2006.01) | |
| *B65G 1/04* | (2006.01) | |
| *B25J 15/00* | (2006.01) | |
| *B65G 47/90* | (2006.01) | |

(52) U.S. Cl.
CPC ........ *H01L 21/6773* (2013.01); *B65G 1/0464* (2013.01); *B66C 1/28* (2013.01); *B66C 1/663* (2013.01); *B66C 13/23* (2013.01); *H01L 21/67733* (2013.01); *H01L 21/67742* (2013.01); *H01L 21/67769* (2013.01); *B25J 15/0061* (2013.01); *B65G 47/907* (2013.01); *B65G 2203/0258* (2013.01)

(58) Field of Classification Search
USPC ........................................ 700/213
See application file for complete search history.

(56) References Cited

U.S. PATENT DOCUMENTS 5,983,479 A * 11/1999 Sato .................. H01L 21/68707
29/426.1
6,655,898 B1 * 12/2003 Liu-Barba ......... H01L 21/67766
187/404

(Continued)

FOREIGN PATENT DOCUMENTS

JP          201548194 A      3/2015

*Primary Examiner* — Kyle O Logan
(74) *Attorney, Agent, or Firm* — The Webb Law Firm

(57) ABSTRACT

A transport vehicle for transporting a transportation-target object to a placement location that is provided at a lower position, includes: a supporting portion configured to support the transportation-target object; a lifting/lowering portion configured to lift and lower the transportation-target object in a suspended state; and a weight detecting portion configured to detect a weight of the transportation-target object, wherein a lowering speed of the transportation-target object is increased after a detection value that is detected by the weight detecting portion while the transportation-target object is being lowered by the lifting/lowering portion in a state where the transportation-target object is supported by the supporting portion has become smaller than or equal to a first set value, and thereafter, the supporting of the transportation-target object by the supporting portion is canceled after the suspending of the transportation-target object by the lifting/lowering portion has been canceled.

6 Claims, 9 Drawing Sheets

(56) References Cited

U.S. PATENT DOCUMENTS

| | | | | |
|---|---|---|---|---|
| 6,851,913 | B2* | 2/2005 | Iizuka | B66C 1/28 414/626 |
| 8,579,128 | B2* | 11/2013 | Kawabata | B66C 1/28 212/327 |
| 8,977,387 | B2* | 3/2015 | Wang | H01L 21/67763 700/228 |
| 2006/0051192 | A1* | 3/2006 | Fujiki | B65G 37/02 414/626 |
| 2007/0059131 | A1* | 3/2007 | Yoshitaka | B65G 37/02 414/217 |
| 2007/0110547 | A1* | 5/2007 | Doherty | H01L 21/67733 414/331.02 |
| 2008/0221728 | A1* | 9/2008 | Inui | B61B 3/02 700/230 |
| 2012/0152693 | A1* | 6/2012 | Kawamura | H01L 21/67259 198/340 |
| 2014/0069775 | A1* | 3/2014 | Ueda | B65G 1/0421 198/470.1 |
| 2015/0063963 | A1* | 3/2015 | Kinugawa | H01L 21/67733 414/561 |
| 2015/0197412 | A1* | 7/2015 | Tomida | B66C 13/06 212/273 |
| 2015/0255318 | A1* | 9/2015 | Wada | H01L 21/67733 212/276 |

* cited by examiner

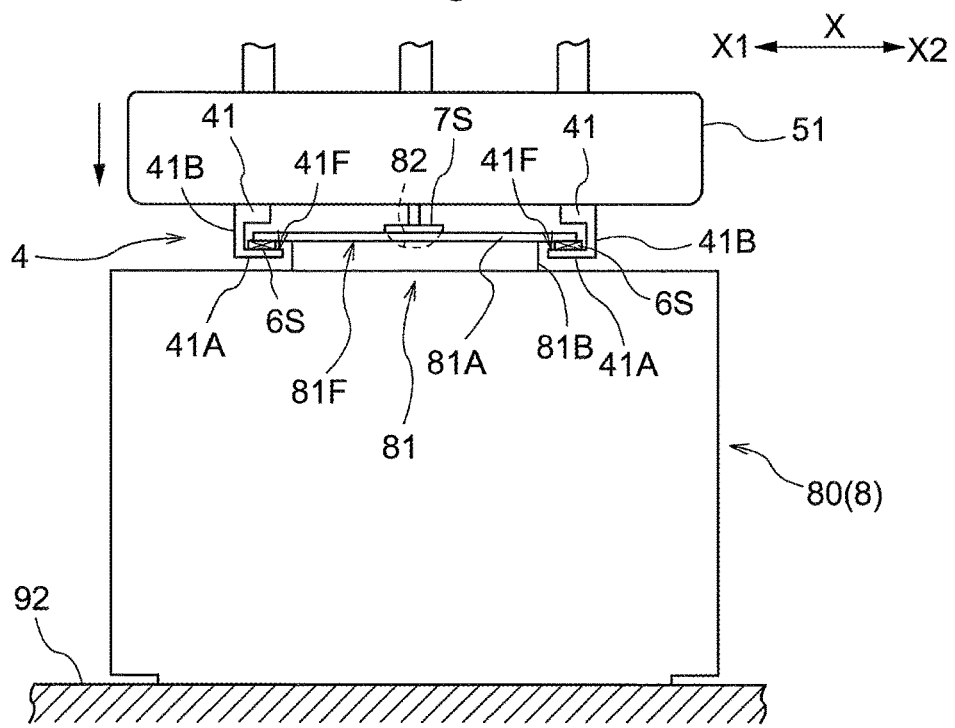
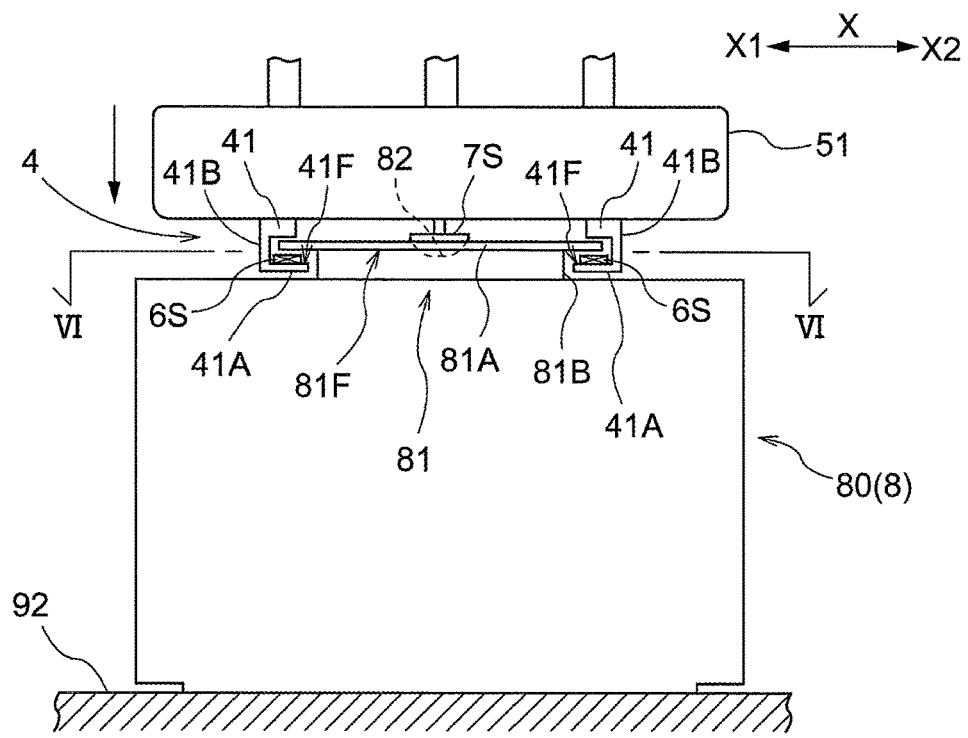

TRANSPORT VEHICLE

CROSS-REFERENCE TO RELATED APPLICATION

This application claims priority to Japanese Patent Application No. 2016-213246 filed Oct. 31, 2016, the disclosure of which is hereby incorporated in its entirety by reference.

FIELD OF THE INVENTION

The present invention relates to a transport vehicle that includes a lifting/lowering portion for lifting and lowering a transportation-target object.

BACKGROUND

For example, a transport vehicle disclosed in JP 2015-48194A (Patent Document 1) includes a lifting/lowering portion for lifting and lowering a transportation-target object in a suspended state, and delivers the transportation-target object to a placement location that is provided below this transport vehicle. In this kind of technique, a set value of a lifting/lowering distance is determined corresponding to the distance from the transport vehicle to the placement location in the up-down direction. The transport vehicle causes the lifting/lowering portion to lower the transportation-target object based on this set value, and delivers the transportation-target object to the placement location when the height of the transportation-target object becomes the same as the height of the placement location upon completing the lowering.

SUMMARY OF THE INVENTION

When the transportation-target object is delivered to the placement location with the above technique, a portion of the load of the transportation-target object begins to transfer to the placement location when the lowering transportation-target object comes into contact, from above, with the placement location. As a result of the transportation-target object being lowered further, the entire load transfers to the placement location after a predetermined time has elapsed. Thus, the transportation-target object is delivered from the transport vehicle to the placement location. As mentioned above, with a technique such as one described in Patent Document 1, a transportation-target object is lowered based on the set value. Accordingly, a series of lowering operations starting from the start of lowering until completion of the lowering is performed under predetermined, fixed speed control. The timing at which the transportation-target object comes into contact with a placement location is not necessarily the same, depending on the state of transport of each transportation-target object, which may involve the weight thereof, etc. For this reason, if the lowering of the transportation-target object is controlled in accordance with the set value, the control will be uniformly performed even if there is a slight variation in the timing at which the transportation-target object comes into contact with the placement location. In this case, to address the variation in the timing at which the transportation-target object comes into contact with the placement location, control is performed so that the lowering speed of the transportation-target object is sufficiently low for a certain period of time before and after the transportation-target object comes into contact with the placement location. However, if the lowering speed of the transportation-target object is lowered, the time taken to complete the lowering is prolonged as much, leading to a decrease in transport efficiency. The technique in Patent Document 1 has room for improvement in this regard.

Realization of a transport vehicle is desired that is able to improve transport efficiency by performing speed control so as to address a variation in the timing at which a transportation-target object comes into contact with a placement location.

A transport vehicle for transporting a transportation-target object to a placement location that is provided at a lower position, includes: a supporting portion configured to support the transportation-target object; a lifting/lowering portion configured to lift and lower the transportation-target object in a suspended state; and a weight detecting portion configured to detect a weight of the transportation-target object, wherein a lowering speed of the transportation-target object is increased after a detection value that is detected by the weight detecting portion while the transportation-target object is being lowered by the lifting/lowering portion in a state where the transportation-target object is supported by the supporting portion has become smaller than or equal to a first set value, and thereafter, the supporting of the transportation-target object by the supporting portion is canceled after the suspending of the transportation-target object by the lifting/lowering portion has been canceled.

With this configuration, the weight of the transportation-target object that is in the process of being lowered can be detected using the weight detecting portion. Here, since the weight detecting portion is included in the transport vehicle, in practice, the weight detecting portion detects the weight of the transportation-target object that is supported by the transport vehicle. That is to say, the weight detecting portion can detect a change in the weight of the transportation-target object when the lowering speed increases or decreases, or due to the transportation-target object coming into contact with the placement location, for example. With this configuration, using this, it can be determined that the transportation-target object has come into contact with the placement location, based on the detection value detected by the weight detecting portion being lower than the first set value. After the transportation-target object has come into contact with the placement location, a situation where the transportation-target object collides with the placement location does not occur even if the lowering speed of the transportation-target object is increased. For this reason, in this embodiment, the lowering speed of the transportation-target object is increased after the detection value detected by the weight detecting portion has become lower than or equal to the first set value. Thus, it is possible to shorten the time taken from when the transportation-target object comes into contact with the placement location until the transportation-target object is completely supported by the placement location and the suspending of the transportation-target object is canceled. That is to say, with this configuration, transport efficiency can be increased by performing speed control so as to address a variation in the timing at which a transportation-target object comes into contact with a placement location.

Further features and advantages of the technique according to the present disclosure will be more apparent from the following description of exemplary and non-limiting embodiments with reference to the drawings.

BRIEF DESCRIPTION OF THE DRAWINGS

FIG. 4 shows a load transfer starting state.

FIG. 5 shows a load transfer completion state.

DETAILED DESCRIPTION OF PREFERRED EMBODIMENTS

1. First Embodiment 1-1. Mechanical Configuration of Transport Vehicle

The first embodiment of a transport vehicle will be described with reference to the drawings.

Figure 1:
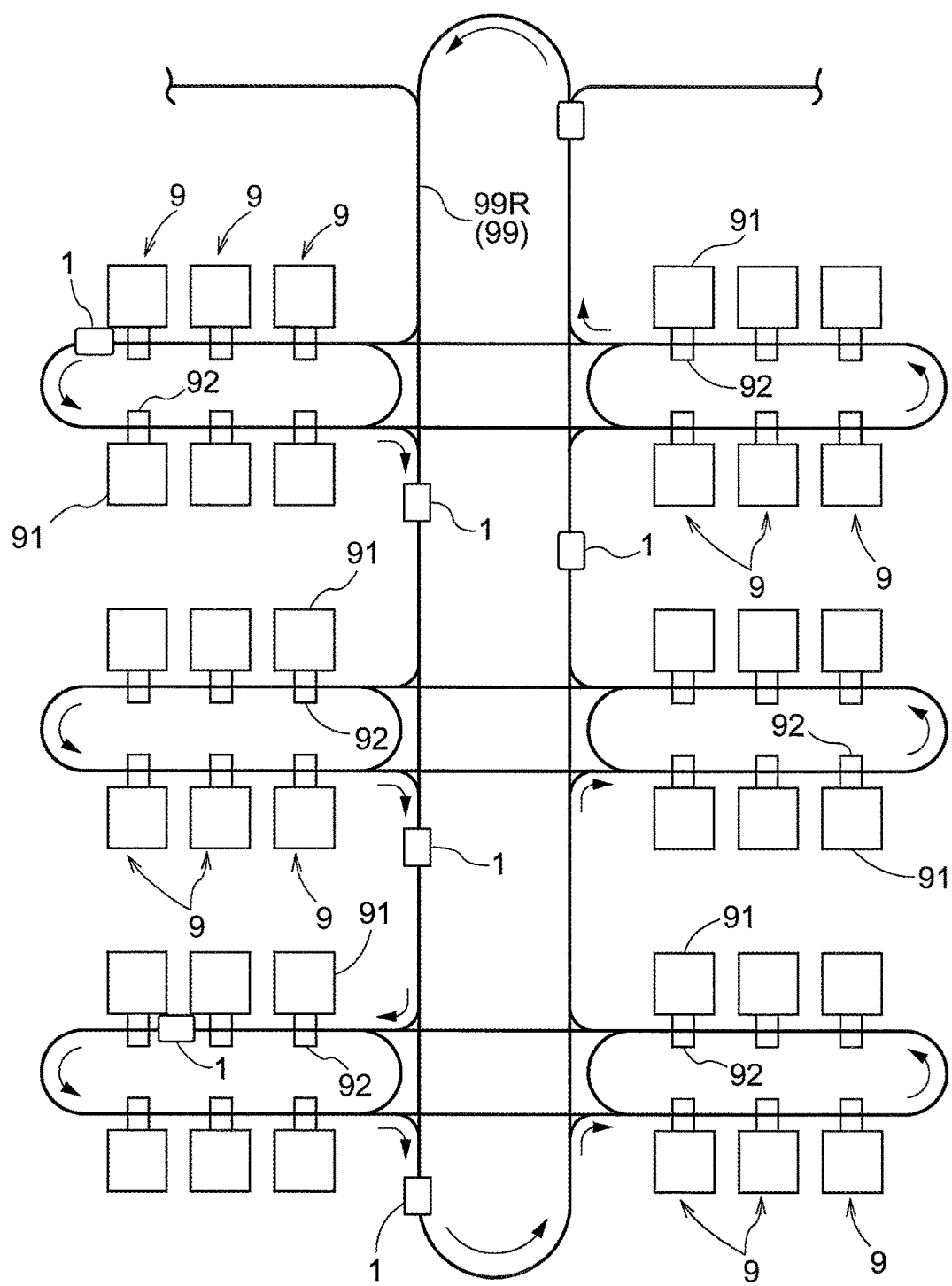
FIG. 1 is a plan view of a transport facility that includes a transport vehicle.
Figure 2:
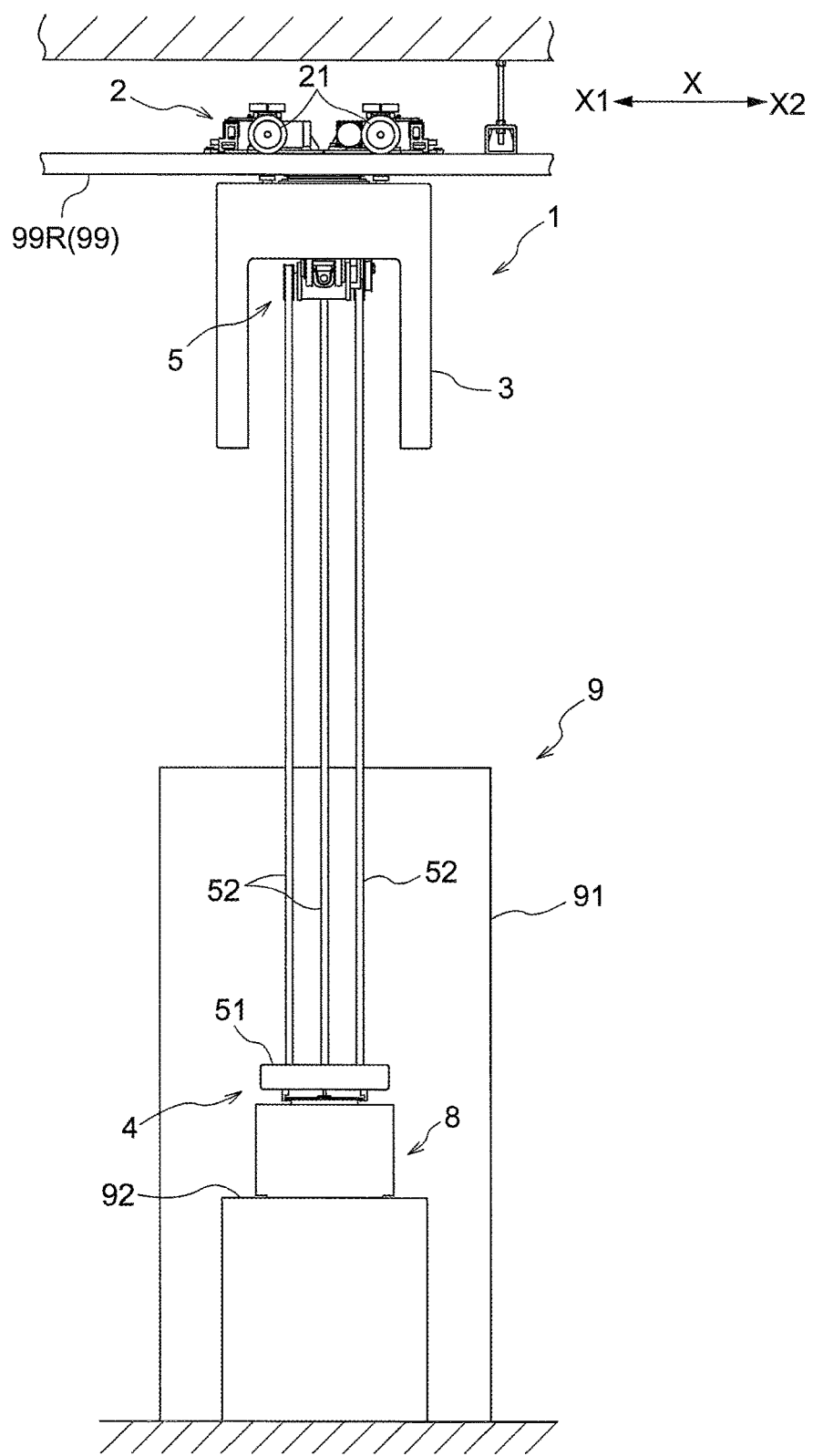
FIG. 2 is a side view of the transport vehicle showing a situation where a transportation-target object is delivered to a placement location.

As shown in FIGS. 1 and 2, a transport vehicle 1 transports a transportation-target object 8 to a transport destination 9.

In this embodiment, in a transport facility that includes a plurality of transport destinations 9, the transport vehicle 1 transports a transportation-target object 8 to each of the plurality of transport destinations 9. The transportation-target object 8, which is subjected to transport, may be a single article, or may also be a combination of a plurality of articles, such as an object to be accommodated and a container for accommodating this object, for example. In this embodiment, the transportation-target object 8 includes a semiconductor substrate 80T, and a container 80 for accommodating the semiconductor substrate 80T (see FIG. 3).

In this embodiment, each of the transport destinations 9 is configured to include a processing device 91 for processing the semiconductor substrate 80T, and a placement location 92 on which the container 80 is to be placed. For example, the processing device 91 takes out the semiconductor substrate 80T from the container 80 that is placed on the placement location 92, and processes this semiconductor substrate 80T. The processing device 91 also puts the post-processing semiconductor substrate 80T into the container 80 placed on the placement location 92. As shown in FIG. 1, the plurality of transport destinations 9 are provided in the transport facility. For example, the transport facility is provided with a transport path 99, which passes through the plurality of transport destinations 9. As shown in FIG. 2, in this embodiment, the transport path 99 is defined by a rail 99R, which is connected to a ceiling. The placement location 92 is provided below the rail 99R so as to be overlapped by the rail 99R when seen in a plan view (see FIG. 1).

In this embodiment, the transport vehicle 1 is an overhead hoist vehicle that travels along the rail 99R to transport the transportation-target object 8 to each of the plurality of transport destinations 9. In this embodiment, a plurality of such transport vehicles 1 are provided in the transport facility. As shown in FIG. 2, each of the transport vehicles 1 transports a transportation-target object 8 to a placement location 92 that is provided downward thereof. In other words, the transport vehicle 1 lowers the transportation-target object 8 from the height at which the transport vehicle 1 is arranged (the height of the rail 99R) toward the placement location 92 that is provided at a lower height, and places this transportation-target object 8 onto the placement location 92.

Figure 3:
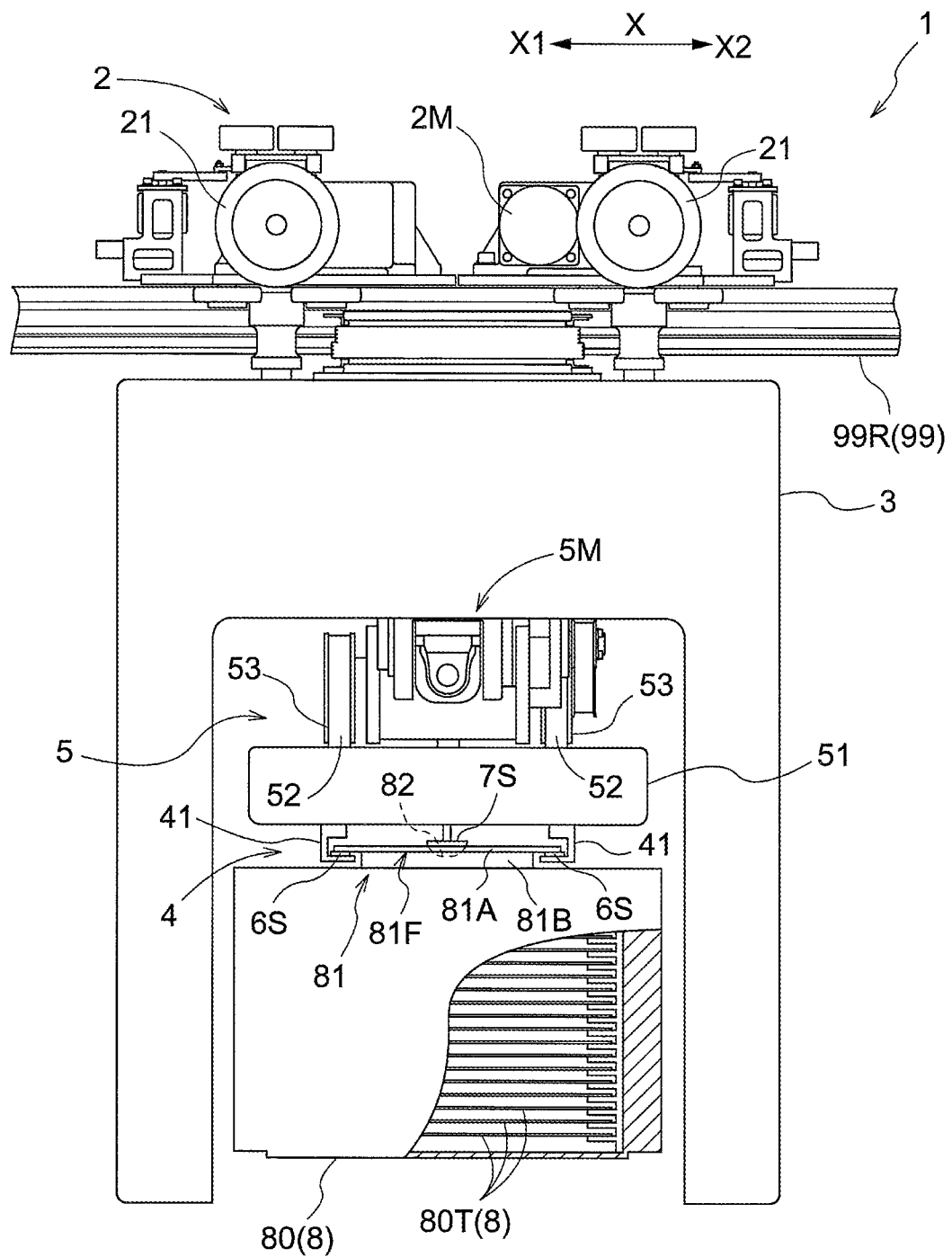
FIG. 3 is a side view showing a detailed configuration of the transport vehicle.

As shown in FIG. 3, the transport vehicle 1 transports the transportation-target object 8 in a suspended state. In this embodiment, the container 80 that constitutes the transportation-target object 8 can accommodate a plurality of semiconductor substrates 80T. For example, the container 80 can accommodate the plurality of semiconductor substrates 80T separately in a plurality of levels. The container 80 has a supported portion 81 with which the container 80 is supported by the transport vehicle 1 in a suspended manner. For example, the supported portion 81 is provided on an outer face of the container 80. In this embodiment, the supported portion 81 is provided on an upper face of the container 80. The supported portion 81 includes a rising portion 81B, which rises from the upper face of the container 80, and an expanded-size portion 81A, in which the size thereof expands in the horizontal direction at an upper end of the rising portion 81B. The expanded-size portion 81A is formed to be larger than the rising portion 81B when viewed in a plan view. Here, due to a portion of the expanded-size portion 81A near the outer edge protruding from the rising portion 81B, a step portion that has a downward face is formed in the supported portion 81. For example, the expanded-size portion 81A is formed in a polygonal shape or a circular shape, for example, when viewed in a plan view. In this example, the expanded-size portion 81A is formed in a quadrangular shape when viewed in a plan view. In this embodiment, the expanded-size portion 81A has a supported face 81F that is to be supported by the transport vehicle 1. The supported face 81F is formed in a portion of the expanded-size portion 81A that protrudes from the rising portion 81B. The supported face 81F is formed in the downward face of the expanded-size portion 81A. A recessed portion 82, into which a later-described abnormality detecting portion 7S is fitted, is formed in an upper face of the expanded-size portion 81A.

As shown in FIG. 3, the transport vehicles 1 include a traveling portion 2, which travels along the transport path 99 that is provided along a ceiling face (not shown), an accommodating portion 3 for accommodating the transportation-target object 8, a supporting portion 4 for supporting the transportation-target object 8, a lifting/lowering portion 5 for lifting and lowering the transportation-target object 8 in a suspended state, and a weight detecting portion 6S for detecting the weight of the transportation-target object 8.

The traveling portion 2 travels on the rail 99R along the transport path 99. In this embodiment, the traveling portion 2 includes traveling wheels 21, which are driven by a traveling motor 2M to rotate around respective horizontal shafts, and roll in a path longitudinal direction X of the transport path 99 on the upper face of the rail 99R. For example, the transport vehicle 1 includes a traveling speed detecting portion 2S that is able to detect a traveling speed VR of the transport vehicle 1 (see FIG. 7). The traveling speed detecting portion 2S may also be provided in the traveling portion 2. For example, the traveling speed detecting portion 2S is configured to be able to detect the traveling speed VR of the transport vehicle 1 based on the number of rotations of the traveling wheels 21 in a predetermined amount of time, a relative speed thereof with respect to the rail 99R, or the like. Note that, in the following description, one side in the path longitudinal direction X is referred to as a first side X1 in the path longitudinal direction, and the other side is referred to as a second side X2 in the path longitudinal direction. Also, in the following description, a direction that is parallel to the horizontal direction and is perpendicular to the path longitudinal direction X is referred to as a path width direction Y, one side in the path width direction Y is referred to as a first side Y1 in the path width direction, and the other side is referred to as a second side Y2 in the path width direction.

The accommodating portion 3 can accommodate the transportation-target object 8, and can also accommodate the supporting portion 4 and the lifting/lowering portion 5. In this embodiment, the accommodating portion 3 is open on both sides in the path width direction Y and on a lower side. More specifically, the accommodating portion 3 is formed in a reversed U-shape with corners when viewed in the path width direction Y (see FIG. 3). In this embodiment, the accommodating portion 3 accommodates the transportation-target object 8 so as to cover the transportation-target object 8 from above and both sides in the path longitudinal direction X. In the following description, the position of the transportation-target object 8 in a state of being accommodated in the accommodating portion 3 is referred to as a home position.

Figure 6:
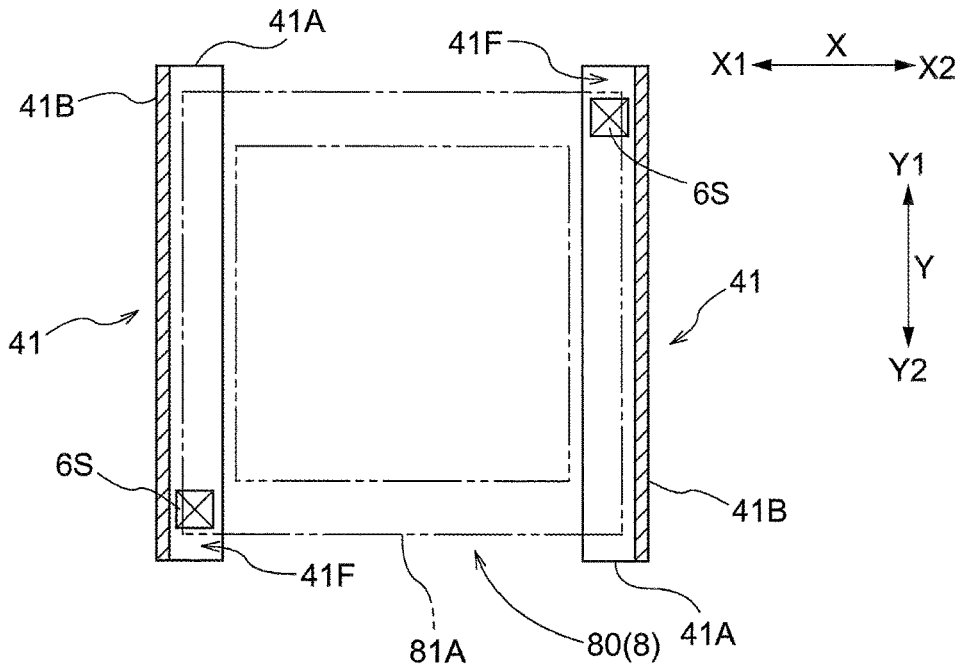
FIG. 6 is a cross-sectional view taken along a line VI-VI in FIG. 5.

The supporting portion 4 supports the transportation-target object 8 while this transportation-target object 8 is being transported. In this embodiment, the supporting portion 4 supports the container 80 that constitutes the transportation-target object 8. More specifically, the supporting portion 4 supports the entire transportation-target object 8 by supporting the supported portion 81 of the container 80. In this embodiment, the supporting portion 4 has a pair of support claws 41, which can be driven by a support motor 4M to switch between a support posture and a release posture. As shown in FIGS. 4 to 6, in this embodiment, the pair of support claws 41 are arranged separate from each other in the path longitudinal direction X. The pair of support claws 41 move in directions approaching each other to enter the support posture, and move in directions separating from each other to enter the release posture.

In this embodiment, the pair of support claws 41 is provided on a later-described lift 51 so as to protrude downward from the lift 51. Each of the pair of support claws 41 includes a connecting portion 41B, which is connected to the lift 51, and a support plate portion 41A, which is formed at the lower end of each connecting portion 41B. As shown in FIG. 6, in this embodiment, the support plate portion 41A is formed in a plate shape that extends in the path width direction Y, and is formed in a rectangular shape when viewed in a plan view. The support plate portion 41A is arranged so that two main surfaces thereof face upward and downward, respectively. In this embodiment, a supporting face 41F for supporting, from below, the supported face 81F of the transportation-target object 8 is formed in a main surface of the support plate portion 41A that faces upward. Note that the supporting face 41F supporting the supported face 81F includes the case where the supporting face 41F directly supports the supported face 81F, as well as the case where the supporting face 41F indirectly supports the supported face 81F via other members. In this embodiment, the supporting face 41F supports the supported face 81F via the later-described weight detecting portions 6S. As shown in FIG. 6, the connecting portion 41B is formed so as to rise from an end of the support plate portion 41A in the path longitudinal direction X. More specifically, the connecting portion 41B of one of the pair of support claws 41 that is arranged on the first side X1 in the path longitudinal direction is formed so as to rise from an end of the support plate portion 41A on the first side X1 in the path longitudinal direction. The connecting portion 41B of the other one of the pair of support claws 41 that is arranged on the second side X2 in the path longitudinal direction is formed so as to rise from an end of the support plate portion 41A on the second side X2 in the path longitudinal direction.

Figure 7:
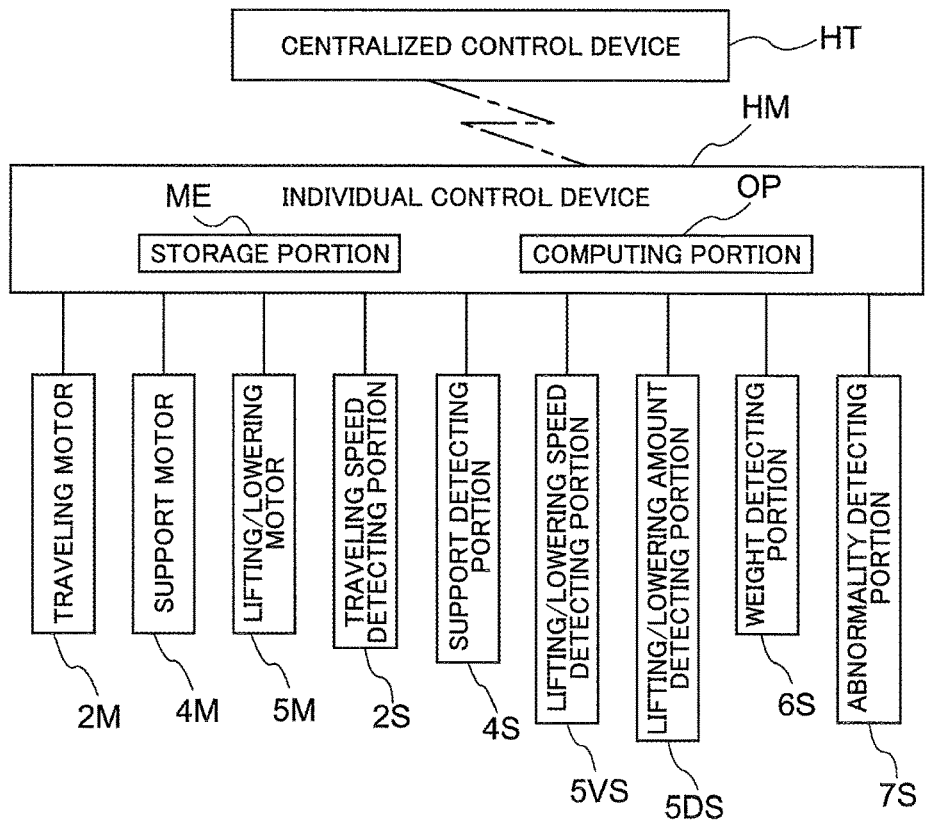
FIG. 7 is a block diagram showing a control configuration.

In this embodiment, the supporting portion 4 includes a support detecting portion 4S for detecting a support posture state and a release posture state of the pair of support claws 41 (see FIG. 7). For example, the support detecting portion 4S is configured to be able to detect whether the pair of support claws 41 are in the support posture state or the release posture state, based on, for example, whether or not an optical axis is blocked by the pair of support claws 41. Note that the aforementioned support posture of the support claws 41 refers to a posture in which the supporting faces 41F are at least partially arranged below the supported face 81F. In other words, the support posture is a posture in which the supporting faces 41F and the supported face 81F overlap each when viewed in a plan view. The release posture of the support claws 41 is a posture in which the supporting faces 41F and the supported face 81F do not overlap each other when viewed in a plan view.

The weight detecting portions 6S detect the weight of the transportation-target object 8. In this embodiment, the weight detecting portions 6S detect the weight of the transportation-target object 8 that is being supported by the transport vehicle 1. More specifically, the weight detecting portions 6S detect a change in the weight of the transportation-target object 8 while being caused to travel by the traveling portion 2 and while being lifted and lowered by the lifting/lowering portion 5. In this embodiment, the weight detecting portions 6S detect the weight of the transportation-target object 8 in a state of being supported by the supporting portion 4. As shown in FIGS. 4 to 6, in this example, the weight detecting portions 6S are provided in the supporting portion 4. More specifically, a weight detecting portion 6S is provided in the supporting face 41F of each of the pair of support plate portions 41A. As shown in FIG. 6, in this embodiment, the weight detecting portion 6S that is provided on the supporting face 41F of one of the pair of support claws 41 that is arranged on the first side X1 in the path longitudinal direction is arranged near an end of this supporting face 41F on the second side Y2 in the path width direction. The weight detecting portion 6S that is provided on the supporting face 41F of the support claw 41 that is arranged on the second side X2 in the path longitudinal direction is arranged near an end of this supporting face 41F on the first side Y1 in the path width direction. In other words, in a state where the supporting portion 4 is supporting the transportation-target object 8, this pair of weight detecting portions 6S are arranged corresponding to diagonal positions of the expanded-size portion 81A of the supported portion 81, which has a quadrangular shape when viewed in a plan view (see FIG. 6). Thus, the load of the transportation-target object 8 substantially equally works on each of the pair of weight detecting portions 6S, and accordingly, the weight of the transportation-target object 8 can be accurately detected.

In a state where the transportation-target object 8 is supported by the supporting portion 4, the weight detecting portions 6S are in a state of being sandwiched by the supporting faces 41F and the supported face 81F in the up-down direction. The weight detecting portions 6S are configured to be able to detect the weight of the transportation-target object 8 by detecting the load that is generated when being pressed against the supporting faces 41F and the supported face 81F in the up-down direction. The weight detecting portions 6S may be any kind of various detection device. For example, it is favorable to use, as the weight detecting portions 6S, a load cell that converts a load into an electrical signal. The load cell may be any of various types of load cells including a capacitive type, a strain gage type, and any other types.

As shown in FIGS. 2 and 3, the lifting/lowering portion 5 lifts and lowers the transportation-target object 8 in a suspended state.

In this embodiment, the lifting/lowering portion 5 includes a lift 51, lifting/lowering pulleys 53, around each of which a lifting/lowering belt 52 is wound, and a lifting/lowering motor 5M for driving the lifting/lowering pulleys 53 (see FIG. 7). The lifting/lowering portion 5 feeds and winds the lifting/lowering belts 52 by driving the lifting/lowering pulley 53 using the lifting/lowering motor 5M. Thus, the lifting/lowering portion 5 can lift and lower the lift 51 that is connected to the lifting/lowering belts 52. In this example, the lift 51 is connected to the supporting portion 4. Thus, the lifting/lowering portion 5 can lift and lower the transportation-target object 8 that is supported by the supporting portion 4. The lift 51 can be lifted and lowered from a state in which the transportation-target object 8 is located at the home position at which the transportation-target object 8 is accommodated in the accommodating portion 3 to a state where the transportation-target object 8 is placed on the placement location 92. That is to say, the lifting/lowering portion 5 can lift and lower the transportation-target object 8 at least between the height at which the transport vehicle 1 is arranged and the height at which the placement location 92 is arranged. In this embodiment, the lifting/lowering portion 5 includes a lifting/lowering speed detecting portion 5VS for detecting the lifting/lowering speed VII of the lift 51 (see FIG. 7). For example, the lifting/lowering speed detecting portion 5VS is configured to be able to detect the lifting/lowering speed VII of the lift 51 based on the number of rotations and rotating time of the lifting/lowering pulleys 53. The lifting/lowering portion 5 includes a lifting/lowering amount detecting portion 5DS for detecting the lifting/lowering amount DA of the lift 51 (see FIG. 7). For example, the lifting/lowering amount detecting portion 5DS is configured to be able to detect the lifting/lowering amount DA of the lift 51 based on the number of rotations and rotating time of the lifting/lowering pulleys 53 when the lift 51 is lifted or lowered, for example. Note that, in this embodiment, the lift 51 and the supporting portion 4 that is connected thereto are accommodated in the accommodating portion 3 by fully winding the lifting/lowering belts 52. In this state, the transportation-target object 8 supported by the supporting portion 4 is arranged at the home position.

In this embodiment, the transportation-target object 8 moves in the up-down direction in a state of being supported by the supporting portion 4 as the lift 51 is lifted and lowered, and moves along the transport path 99 as the traveling portion 2 travels. In the following description, there may be cases where the transportation-target object 8 being lifted and lowered as the lift 51 is lifted and lowered is simply expressed as "the transportation-target object 8 being lifted and lowered". There may also be cases where the transportation-target object 8 moving along the conveyance path 99 as the traveling portion 2 travels is simply expressed as "the transportation-target object 8 moving along the transport path 99". That is to say, the transportation-target object 8 can be lifted and lowered at the lifting/lowering speed VII, and can move along the transport path 99 at the traveling speed VR.

1-2. Control Configuration of Transport Vehicle

Next, a control configuration of the transport vehicles 1 will be described with reference to FIG. 7.

Each of the transport vehicles 1 includes an individual control device HM for controlling operations of this transport vehicle 1. For example, in the transport facility in which the transport vehicles 1 are provided, a centralized control device HT for controlling the entire facility including individual control devices HM is provided. The centralized control device HT controls the entire transport facility including a plurality of individual control devices HM. For example, the centralized control device HT and the individual control devices HM each include a processor such as a microcomputer, a peripheral circuit such as a memory, and so on. Functions of the centralized control device HT and the individual control devices HM are realized through cooperation between the aforementioned hardware and programs that are executed on a processor such as a computer.

In this embodiment, the centralized control device HT and the individual control devices HM can communicate with each other.

For example, to move a transport vehicle 1 to a transport destination 9 or the like, the centralized control device HT outputs a movement command to the individual control device HM that corresponds to this transport vehicle 1. The individual control device HM that has received the movement command can move the transport vehicle 1 to the transport destination 9 or the like by controlling operations of this transport vehicle 1.

In this embodiment, each individual control device HM includes a storage portion ME and a computing portion OP. The individual control device HM acquires various kinds of information that is detected by the traveling speed detecting portion 2S, the lifting/lowering speed detecting portion 5VS, the lifting/lowering amount detecting portion 5DS, the support detecting portion 4S, the weight detecting portions 6S, and the abnormality detecting portion 7S, and stores this information in the storage portion ME. Based on this information, or based on the result of computation that the computing portion OP performs on this information, the individual control device HM controls operations of the traveling motor 2M, the support motor 4M, and the lifting/lowering motor 5M.

1-3. Operations of Transport Vehicle

Next, operations of the transport vehicle 1 will be described.

Figure 8:
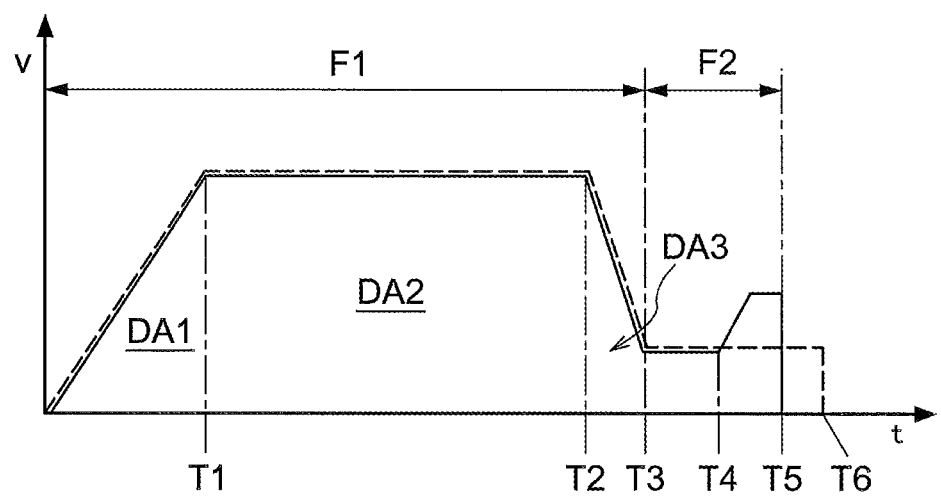
FIG. 8 is a time chart from a start of lowering of a lift until completion of the lowering.

For example, the transport vehicle 1, upon receiving a command from the centralized control device HT, travels toward a target transport destination 9, and stops above the placement location 92 that corresponds to the target transport destination 9. The transport vehicle 1 then causes the lifting/lowering portion 5 to lower the transportation-target object 8 from the home position (which is the inside of the accommodating portion 3), and places the transportation-target object 8 onto the placement location 92. In this embodiment, first lowering processing and second lowering processing are performed in the process of placing the transportation-target object 8 on the placement location 92. The first lowering processing is processing to control the speed of the lift 51 based on the lowering amount DA of the lift 51. As shown in FIG. 8, the first lowering processing is performed in a first phase F1. In this example, the first lowering processing ends at time T3. The second lowering processing is executed at the same time as the first lowering processing ends. The second lowering processing is processing to control the speed of the lift 51 based on a change in the weight of the transportation-target object 8. The second lowering processing is performed in a second phase F2. In this example, the second lowering processing starts at time T3, and ends at time T5.

Here, in this embodiment, the lifting/lowering portion 5 can perform constant speed-lowering, i.e. lower the transportation-target object 8 at a constant speed. The lifting/lowering portion 5 can also perform acceleration-lowering, i.e. lower the transportation-target object 8 while increasing the speed, and perform deceleration-lowering, i.e. lower the transportation-target object 8 while reducing the speed. In this embodiment, the speed of the lift 51 (transportation-target object 8) is controlled by performing the acceleration-lowering, the constant speed-lowering, and the deceleration-lowering according to various situations.

A description will be given, based on FIG. 9, of a control procedure for transporting (placing) the transportation-target object 8 to (onto) the placement location 92 from the home position. After the transport vehicle 1 has stopped above the placement location 92 that corresponds to a target transport destination 9, the individual control device HM first performs the first lowering processing to transport (place) the transportation-target object 8 to (onto) the placement location 92 (#100). To address a variation in the timing at which the transportation-target object 8 comes into contact with the placement location 92, the individual control device HM performs the first lowering processing, thereby controlling the lowering speed VH of the lift 51 in a low state during a the period of time taken for the transportation-target object 8 to come into contact with the placement location 92. Here, the variation in the timing at which the transportation-target object 8 comes into contact with the placement location 92 derives from stretching of the lifting/lowering belts 52, a current of air flowing within the facility, or the like. For example, if the force that pulls down the lifting/lowering belts 52 due to the weight of the transportation-target object 8 differs, the lifting/lowering belts 52 stretches differently. In addition, usually, the semiconductor substrates 80T are processed in a so-called clean room. The inside of a clean room is kept clean. In a clean room, a down flow is caused to suppress dust or the like from floating. For example, in a clean room, an air current may be generated due to this down flow. If the transportation-target object 8 or the like vibrates due to the air current, the timing at which the transportation-target object 8 comes into contact with the placement location 92 may vary. In this embodiment, speed control is performed to deal with such a variation in timing.

As mentioned above, the individual control device HM performs the first lowering processing in the first phase F1 (see FIG. 8). More specifically, the individual control device HM performs the acceleration-lowering at the same time as lowering starts, and performs the constant speed-lowering (first constant speed-lowering: e.g. lowering at the highest speed within a speed limit) after the lift 51 has been lowered by a first lowering amount DA1. After the constant speed-lowering has been performed and the lift 51 has been lowered by a second lowering amount DA2, the individual control device HM performs the deceleration-lowering. Furthermore, after the deceleration-lowering has been performed and the lift 51 has further been lowered by a third lowering amount DA3, the individual control device HM again performs the constant speed-lowering (second constant speed-lowering). The first lowering processing ends when the first phase F1 ends at time T3 in FIG. 8. Then, the second lowering processing is performed simultaneously with the end of the first lowering processing.

Figure 9:
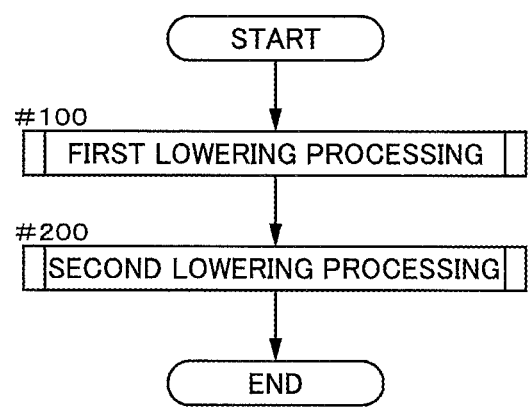
FIG. 9 is a flowchart showing a procedure of delivering the transportation-target object to the placement location.

As shown in FIG. 9, the individual control device HM performs the second lowering processing (#200) after performing the first lowering processing (#100). The individual control device HM performs the second lowering processing to detect a change in the weight of the transportation-target object 8 while the lift 51 is being lowered, thereby performing speed control to address a variation in the timing at which the transportation-target object 8 comes into contact with the placement location 92. For example, when lowering of the lift 51 starts, the transport vehicle 1 is in a state of supporting the entire load of the transportation-target object 8. Then, as shown in FIG. 4, the load of the transportation-target object 8 begins to partially transfer to the placement location 92 (hereinafter referred to as "load transfer starting state") at the time when the lowering transportation-target object 8 comes into contact, from above, with the placement location 92. After the transportation-target object 8 has been further lowered from the load transfer starting state, the entire load of the transportation-target object 8 transfers to the placement location 92 (hereinafter referred to as "load transfer completion state"), and the suspending of the transportation-target object 8 is canceled. By further lowering the lift 51 from the load transfer completion state, the supporting faces 41F (weight detecting portions 6S) separate from the supported face 81F as shown in FIG. 5. Thus, the supporting of the transportation-target object 8 by the supporting portion 4 is canceled. Note that the amount of lowering (the amount of rotation of the lifting/lowering pulleys 53) and the lowering time from the load transfer starting state to the load transfer completion state may also differ depending on how much the lifting/lowering belts 52 are stretched with the transportation-target object 8 suspended. That is to say, if the lifting/lowering belts 52 have stretched a large amount due to the transportation-target object 8 being heavy, a certain amount of lowering and certain lowering time are required to restore the stretch of the lifting/lowering belts 52 to a natural length thereof from the load transfer starting state. Then, the load begins to transfer to the placement location 92 from the state where the lifting/lowering belts 52 have restored to their natural length, and ultimately, the load transfer completion state is entered. Meanwhile, if the transportation-target object 8 is lighter than in the above case, the stretch of the lifting/lowering belts 52 is also smaller, and accordingly, the amount of lowering and the lowering time taken for the lifting/lowering belts 52 to restore their natural length from the load transfer starting state are smaller. For this reason, in this case, the amount of lowering and the lowering time taken to enter the load transfer completion state from the load transfer starting state are smaller than in the case where the stretch of the lifting/lowering belts 52 is large.

Here, the first lowering processing addresses a variation in the timing at which the transportation-target object 8 comes into contact with the placement location 92. For this reason, the lowering speed VII of the lift 51 is controlled in a low state for a certain period before and after the transportation-target object 8 comes into contact with the placement location 92. However, after the load transfer starting state has been entered, the transportation-target object 8 is already in contact with the placement location 92. Accordingly, in this embodiment, the individual control device HM performs the acceleration-lowering of the lift 51 after the load transfer starting state has been entered, thereby increasing transport efficiency. Furthermore, in this embodiment, the transport vehicle 1 includes the abnormality detecting portion 7S. As shown in FIGS. 4, 5, and so on, in this embodiment, the abnormality detecting portion 7S is provided so as to protrude downward from the lift 51. The lower end portion of the abnormality detecting portion 7S is arranged so as to be able to be fitted into the recessed portion 82 that is formed in the supported portion 81. Upon the lift 51 being further lowered after the load transfer completion state has been entered, the lift 51 and the transportation-target object 8 relatively move in the up-down direction. By detecting the amount of this relative movement, the distance between the lift 51 and the transportation-target object 8 in the up-down direction can be detected. In this example, if the abnormality detecting portion 7S detects that the lift 51 has been lowered beyond a lowering limit, the lowering of the lift 51 is stopped. For example, the abnormality detecting portion 7S that has detected an abnormality generates a sound indicating the abnormality, or notifies the individual control device HM (or the centralized control device HT) of an error.

Next, the first lowering processing will be described with reference to the time chart in FIG. 8 and the flowchart in FIG. 10. Note that FIG. 8 is a time chart with a horizontal axis indicating time and a vertical axis indicating the speed of the lift 51 (transportation-target object 8). In FIG. 8, a change in speed of the lift 51 in this embodiment is indicated by a solid line, and a change in speed of a lift 51 in a comparative example is indicated by a broken line. In FIG. 8, the area surrounded by the solid line indicating the change in speed and the horizontal axis indicates the lowering amount DA of the lift 51. The individual control device HM performs the first lowering processing in the first phase F1. The first lowering processing is performed with the transportation-target object 8 located at the home position.

Figure 10:
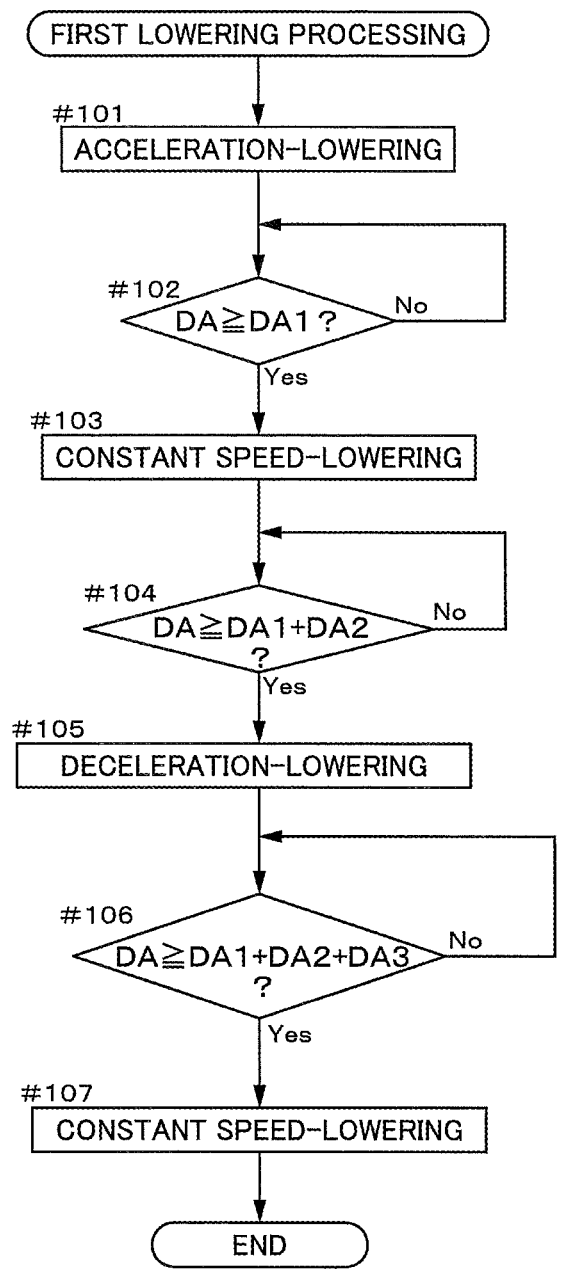
FIG. 10 is a flowchart showing a procedure of executing first lowering processing.

As shown in FIG. 10, the individual control device HM starts to lower the lift 51, and simultaneously starts the acceleration-lowering of the lift 51 (#101). Next, the individual control device HM determines whether or not the lowering amount DA of the lift 51 is greater than or equal to the first lowering amount DA1 (#102). If it is determined that the lowering amount DA of the lift 51 is not yet greater than or equal to the first lowering amount DA1 (#102: No), the individual control device HM again performs step 102 (#102). If it is determined that the lowering amount DA of the lift 51 is greater than or equal to the first lowering amount DA1 (#102: Yes), the individual control device HM starts the constant speed-lowering (first constant speed-lowering) of the lift 51 (#103). In this example, as shown in FIG. 8, the constant speed-lowering of the lift 51 is started at time T1. Next, the individual control device HM determines whether or not the lowering amount DA of the lift 51 after starting to be lowered is greater than or equal to the sum of the first lowering amount DA1 and a second lowering amount DA2 (#104). If it is determined that the lowering amount DA of the lift 51 is not yet greater than or equal to the sum of the first lowering amount DA1 and the second lowering amount DA2 (#104: No), the individual control device HM again performs step 104 (#104). If it is determined that the lowering amount DA of the lift 51 is greater than or equal to the sum of the first lowering amount DA1 and the second lowering amount DA2 (#104: Yes), the individual control device HM starts the deceleration-lowering of the lift 51 (#105). As shown in FIG. 8, the deceleration-lowering of the lift 51 is started at time T2. Next, the individual control device HM determines whether or not the lowering amount DA of the lift 51 after the start of the deceleration-lowering is greater than or equal to the sum of the first lowering amount DA1, the second lowering amount DA2, and a third lowering amount DA3 (#106). If it is determined that the lowering amount DA of the lift 51 is not yet greater than or equal to the sum of the first lowering amount DA1, the second lowering amount DA2, and the third lowering amount DA3 (#106: No), the individual control device HM again performs step 106 (#106). If it is determined that the lowering amount DA of the lift 51 is greater than or equal to the sum of the first lowering amount DA1, the second lowering amount DA2, and the third lowering amount DA3 (#106: Yes), the individual control device HM starts the constant speed-lowering of the lift 51, and also proceeds to the second lowering processing (#107). In this example, as shown in FIG. 8, the deceleration-lowering of the lift 51 ends and the constant speed-lowering starts at time T3. The first lowering processing is performed as described above.

Figure 11:
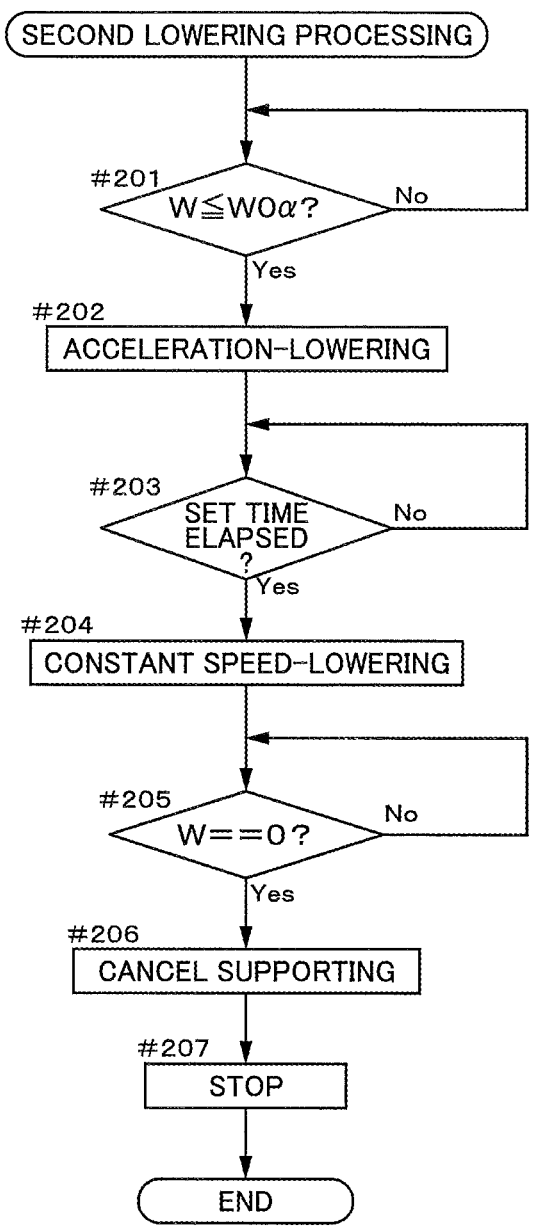
FIG. 11 is a flowchart showing a procedure of executing second lowering processing.

Next, the second lowering processing will be described with reference to the time chart in FIG. 8 and the flowchart in FIG. 11. The second lowering processing is performed after the first lowering processing has been performed. That is to say, the second lowering processing is executed in a state where the lift 51 is lowered at a constant speed through the first lowering processing. As shown in FIG. 8, the individual control device HM executes the second lowering processing in a second phase F2.

In this embodiment, the transport vehicle 1 increases the lowering speed VII of the transportation-target object 8 after a detection value that is detected by the weight detecting portions 6S while the transportation-target object 8 is being lowered by the lifting/lowering portion 5 with the transportation-target object 8 supported by the supporting portion 4 has become a first set value W0α. The transport vehicle 1 also determines whether or not the detection value detected by the weight detecting portions 6S is smaller than or equal to the first set value W0α, while the transportation-target object 8 is being lowered at a constant speed (i.e. second constant speed-lowering). In this embodiment, as shown in FIG. 11, the individual control device HM determines, while the lift 51 is being lowered at a constant speed, whether or not a current detected weight W of the transportation-target object 8, which is the detection value detected by the weight detecting portions 6S, is smaller than or equal to the first set value W0α, which is obtained by multiplying a reference weight W0 of the transportation-target object 8 by a constant α (#201). If it is determined that the detected weight W is smaller than or equal to the first set value W0α (#201: Yes), the individual control device HM starts the acceleration-lowering of the lift 51 (#202). In this example, as shown in FIG. 8, the acceleration-lowering of the lift 51 is started at time T4. As mentioned above, the timing at which the transportation-target object 8 comes into contact with the placement location 92 may vary depending on the situation. For this reason, it is difficult to predict the timing of contact between the transportation-target object 8 and the placement location 92 before this contact occurs. However, by thus lowering the transportation-target object 8 at a low, constant speed (second constant speed-lowering), the impact at the time of contact can be lessened even if the timing of contact between the transportation-target object 8 and the placement location 92 varies. Moreover, if the lift 51 accelerates or decelerates during lowering, the weight of the transportation-target object 8 will vary under the inertia that is generated during the acceleration or deceleration. However, when the lift 51 is being lowered at a constant speed, such a weight change does not occur. Accordingly, the detected weight W of the transportation-target object 8 can be accurately detected, and whether or not this detected weight W is smaller than or equal to the first set value W0α can be accurately determined.

In this embodiment, the first set value W0α is a value that is smaller than the reference weight W0 of the transportation-target object 8 at a set ratio. The reference weight W0 is a detection value that is detected by the weight detecting portions 6S when the transportation-target object 8 is in a stationary state. As a result of the weight detecting portions 6S detecting the reference weight W0 when the transportation-target object 8 is in a stationary state, it is possible to detect the weight of the transportation-target object 8 without being affected by the inertia that acts on the transportation-target object 8. The constant α is set to a number that is greater than 0 and smaller than 1. For example, the constant α is set to 0.7 to 0.95. It is favorable that this first set value W0α is set to a value with which the weight immediately after the load transfer starting state has been entered can be detected. For example, the first set value W0α may be set to a value that is as close as possible to a value for which consideration is given to a detection error due to the inertia when the transportation-target object 8 is lifted or lowered, a detection error associated with the accuracy of the weight detecting portions 6S, and so on. Here, when the lift 51 is being lowered at a constant speed, the weight of the transportation-target object 8 hardly changes. For this reason, the detected weight W is substantially the same as the reference weight W0. Accordingly, if the detected weight W is smaller than or equal to the first set value W0α, it can be determined that the weight of the transportation-target object 8 is lighter than usual. In other words, it can be determined that the current state is the load transfer starting state. As shown in FIG. 11, if it is determined that the detected weight W of the transportation-target object 8 is not smaller than or equal to the first set value W0α (#201: No), the individual control device HM again performs step 201 (#201).

After starting the acceleration-lowering of the lift 51 (#202), the individual control device HM determines whether or not a set time has elapsed (#203). If it is determined that the set time has elapsed (#203: Yes), the individual control device HM starts constant speed-lowering (third constant speed-lowering) of the lift 51 (#204). If it is determined that the set time has not elapsed (#203: No), the individual control device HM again performs step 203 (#203). By thus switching the lowering of the lift 51 from the acceleration-lowering to the constant speed-lowering (third constant speed-lowering) after the set time has elapsed, the lowering can be stopped after the load transfer completion state has been entered, more quickly than in the case of stopping in an acceleration-lowering state.

The transport vehicle 1 determines that the suspending of the transportation-target object 8 from the lifting/lowering portion 5 has been canceled, on the condition that the detection value detected by the weight detecting portions 6S is smaller than or equal to a second set value, which is smaller than the first set value W0α. In this embodiment, the second set value is set to 0. As shown in FIG. 11, after the constant speed-lowering of the lift 51 has started (#204), the individual control device HM determines whether or not the detected weight W of the transportation-target object 8 is 0 (second set value) (#205). As mentioned above, a state where the suspending of the transportation-target object 8 from the lifting/lowering portion 5 has been canceled, i.e. the load transfer completion state, is a state where the entire load of the transportation-target object 8 has transferred to the placement location 92. Accordingly, the weight of the transportation-target object 8 detected by the weight detecting portions 6S at this time is 0. In this embodiment, the second set value is set to 0, and the individual control device HM determines that the load transfer completion state has been entered, when the detected weight W of the transportation-target object 8 is 0. In this embodiment, the transport vehicle 1 increases the lowering speed VII, then cancels the suspending of the transportation-target object 8 from the lifting/lowering portion 5, and thereafter cancels the supporting of the transportation-target object 8 by the supporting portion 4. As shown in FIG. 11, if it is determined that the detected weight W of the transportation-target object 8 is 0 (#205: Yes), the individual control device HM further lowers the lift 51 to separate the supporting faces 41F from the supported face 81F (see also FIG. 5). Thus, the supporting of the transportation-target object 8 by the supporting portion 4 is canceled (#206). If it is determined that the detected weight W of the transportation-target object 8 is not yet 0 (#205: No), the individual control device HM again performs step 205 (#205). Then, after canceling the supporting of the transportation-target object 8 (#206), the individual control device HM stops the lift 51 (#207).

In this embodiment, transport efficiency can be increased, compared with the comparative example, by performing the second lowering processing. As shown in FIG. 8, in this embodiment and in the comparative example, the same speed control is performed until time T4, and the lowering amount DA of the lift 51 is also the same. However, at time T4, the acceleration-lowering of the lift 51 is started in this embodiment, whereas the constant speed-lowering state is maintained in the comparative example. In the comparative example, a time period until time T6 is required to enter the load transfer completion state. In contrast, in this embodiment, the load transfer completion state is entered in a time period until time T5, which is shorter than the time period until time T6. As a result, in this embodiment, the time required to place the transportation-target object 8 onto the placement location 92 is shorter than in the comparative example, and transport efficiency can thus be increased.

In this embodiment, the transport vehicle 1 at least detects the presence of the semiconductor substrate(s) 80T accommodated in the container 80, using the weight detecting portions 6S. For example, the transport vehicle 1 detects the number of semiconductor substrates 80T accommodated in the container 80, using the weight detecting portions 6S. When the transport vehicle 1 transports the transportation-target object 8, there are cases of transporting a container 80 that accommodates the semiconductor substrate(s) 80T, and cases of transporting a container 80 that does not accommodate any semiconductor substrate 80T. Furthermore, even in the cases where the container 80 accommodates the semiconductor substrate(s) 80T, the number of semiconductor substrates 80T accommodated therein may differ.

For example, when a container 80 is processed by the processing device 91 after being placed on the placement location 92 by the transport vehicle 1, an empty container 80 that does not accommodate any semiconductor substrate 80T will wait on the placement location 92 until processing of the semiconductor substrate(s) 80T ends. At this time, for example, if the processing time for the semiconductor substrate(s) 80T is long, there are cases of moving the empty container 80 that is waiting at the placement location 92 to a different place, and cases of transporting other semiconductor substrate(s) 80T into the empty container 80. In such cases, the transport vehicle 1 will transport a container 80 that does not accommodate any semiconductor substrate 80T.

For example, in this embodiment, weight information regarding the container 80 is stored in the storage portion ME in the individual control device HM. The individual control device HM detects the presence of the semiconductor substrate(s) 80T accommodated in the container 80 by comparing the detected weight W of the transportation-target object 8 detected by the weight detecting portions 6S with the weight information regarding the container 80 stored in the storage portion ME. More specifically, if the detected weight W is heavier than the weight of the container 80 stored in the storage portion ME, it can be understood that at least one semiconductor substrate 80T is accommodated in the container 80. The storage portion ME in the individual control device HM also stores a plurality of pieces of weight information that corresponds to the number of semiconductor substrates 80T. By comparing those pieces of weight information with the detected weight W detected by the weight detecting portions 6S, the number of semiconductor substrates 80T accommodated in the container 80 can be detected.

In this embodiment, if the semiconductor substrate(s) 80T is detected by the weight detecting portions 6S, the traveling speed VR of the transportation-target object 8 at which the traveling portion 2 travels is made lower than in the case where no semiconductor substrate 80T is detected. For example, if the container 80 vibrates while the transportation-target object 8 is moving along the transport path 99, there is a possibility that the semiconductor substrate(s) 80T accommodated in the container 80 will hit an inner wall or the like of the container 80 and be damaged. The vibration occurring while the transportation-target object 8 is moving along the transport path 99 is likely to be larger the higher the traveling speed VR of the traveling portion 2, and is likely to be smaller the lower the traveling speed VR. In this embodiment, in the case of transporting a container 80 that accommodates the semiconductor substrate(s) 80T, the traveling speed VR of the traveling portion 2 is made lower than in the case of transporting a container 80 that does not accommodate any semiconductor substrate 80T. Thus, the vibration occurring while a container 80 that accommodates the semiconductor substrate(s) 80T is moving along the transport path 99 can be reduced. Furthermore, a reduction in the vibration suppresses incidents in which the semiconductor substrate(s) 80T hits the inner wall or the like of the container 80. As a result, damage to the semiconductor substrate(s) 80T accommodated in the container 80 can be suppressed. On the other hand, if no semiconductor substrate 80T is accommodated in the container 80, a semiconductor substrate(s) 80T, of which damage is a concern, is not present. Accordingly, in this embodiment, in the case of transporting a container 80 that does not accommodate any semiconductor substrate 80T, the traveling speed VR of the traveling portion 2 is set higher than in the case of transporting a container 80 that accommodates a semiconductor substrate(s) 80T. Thus, transport efficiency can be increased.

Figure 12:
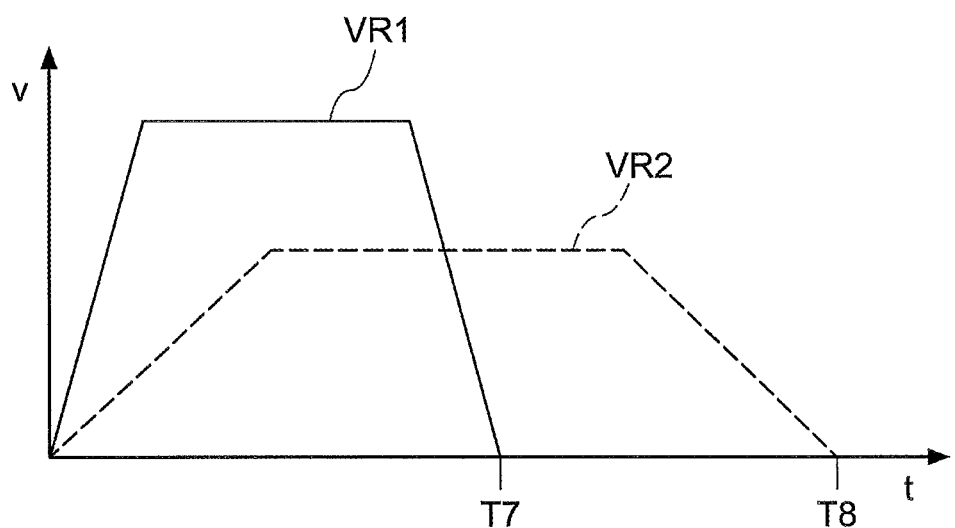
FIG. 12 is a time chart showing traveling speeds at which the transport vehicle travels.

In the time chart shown in FIG. 12, the horizontal axis indicates time, and the vertical axis indicates the traveling speed. A solid line indicates a change in the traveling speed VR1 of the traveling portion 2 when no semiconductor substrate 80T is accommodated in the container 80, and a broken line indicates a change in the traveling speed VR2 of the traveling portion 2 in the case where the semiconductor substrate(s) 80T is accommodated in the container 80. As indicated by the solid line in FIG. 12, the traveling speed VR1 of the traveling portion 2 with no semiconductor substrate 80T accommodated in the container 80 is set higher than the traveling speed VR2 of the traveling portion 2 with the semiconductor substrate(s) 80T accommodated in the container 80. Thus, in the case of traveling the same distance, the traveling time can be made shorter when making the traveling portion 2 travel at the traveling speed VR1 than when making the traveling portion 2 travel at the traveling speed VR2. For example, in the case of traveling the same distance, the amount of time taken to reach time T7 is required when the traveling portion 2 travels at the traveling speed VR1. Meanwhile, the amount of time taken to reach time T8, which is longer than the amount of time taken to reach time T7, is required when the traveling portion 2 travels at the traveling speed VR2. Thus, if no semiconductor substrate 80T is accommodated in the container 80, the traveling speed VII of the traveling portion 2 is increased, and thus transport efficiency can be increased throughout the entire facility.

In this embodiment, if the semiconductor substrate(s) 80T is detected by the weight detecting portions 6S, the lifting/lowering speed VII at which the lifting/lowering portion 5 lifts and lowers the transportation-target object 8 is made lower than in the case where no semiconductor substrate 80T is detected. As mentioned above, in this embodiment, the transportation-target object 8 that is supported by the supporting portion 4, which is connected to the lift 51, is lifted and lowered by lifting and lowering the lift 51 of the lifting/lowering portion 5. Furthermore, similar to the aforementioned case of making the traveling portion 2 travel, there is an issue of the semiconductor substrate(s) 80T being damaged due to vibration when lifting and lowering the lift 51 as well. In this embodiment, in the case of lifting and lowering a container 80 that accommodates the semiconductor substrate(s) 80T, the lifting/lowering speed VII of the lift 51 is made lower than in the case of lifting and lowering a container 80 that does not accommodate any semiconductor substrates 80T. Thus, vibration occurring while a container 80 that accommodates the semiconductor substrate(s) 80T is being lifted and lowered can be reduced. Furthermore, a reduction in the vibration suppresses incidents in which the semiconductor substrate(s) 80T hits the inner wall or the like of the container 80. As a result, damage to the semiconductor substrate(s) 80T accommodated in the container 80 can be suppressed. On the other hand, if no semiconductor substrate 80T is accommodated in the container 80, a semiconductor substrate(s) 80T, of which damage is a concern, is not present. Accordingly, in this embodiment, in the case of lifting and lowering a container 80 that does not accommodate any semiconductor substrate 80T, the lifting/lowering speed VII of the lift 51 is made higher than in the case of lifting and lowering a container 80 that accommodates a semiconductor substrate(s) 80T. Thus, transport efficiency can be increased.

Note that the speed control for the lift 51 performed based on the presence of the semiconductor substrate(s) 80T is substantially the same as the above-described speed control for the traveling portion 2, and a description thereof using the time chart will be omitted accordingly.

2. Other Embodiments

Next, other embodiments of the transport vehicle will be described.

(1) The above embodiment has described an example in which the transport vehicle 1 determines that the suspending of the transportation-target object 8 from the lifting/lowering portion 5 has been canceled, on the condition that the detection value detected by the weight detecting portions 6S is smaller than or equal to the second set value that is smaller than the first set value W0α. However, the present invention is not limited to this example. It may also be determined that the suspending of the transportation-target object 8 from the lifting/lowering portion 5 has been canceled, on at least either condition that the detection value detected by the weight detecting portions 6S is smaller than or equal to the second set value that is smaller than the first set value $W0\alpha$, or that the transportation-target object 8 has been lowered by a set amount that corresponds to the height from the transport vehicle 1 to the placement location 92. For example, the set value is a value obtained by adding an error, such as stretching of the lifting/lowering belts 52, to the distance from a bottom face of the transportation-target object 8 in a state of being located at the home position to a placement surface of the placement location 92. For example, only the lowering of the transportation-target object 8 by the set amount that corresponds to the height from the transport vehicle 1 to the placement location 92 may be considered as the condition for determining that the suspending of the transportation-target object 8 has been canceled. In this case, it can be appropriately determined that the suspending of the transportation-target object 8 has been canceled, even if the weight detecting portions 6S did not function properly. Both of the above conditions being satisfied may be the condition for determining that the suspending of the transportation-target object 8 has been canceled. In this case, it can be more reliably determined that the suspending of the transportation-target object 8 has been canceled than in the case of using either one of the above conditions.

(2) The above embodiment has described an example in which the pair of support claws 41 move in directions approaching each other to enter the support posture, and move in directions separating from each other to enter the release posture. That is, the pair of support claws 41 are configured to be of a sliding type. However, the present invention is not limited to this example. The pair of support claws 41 may also be configured so as to move in directions separating from each other to enter the support posture, and move in directions approaching each other to enter the release posture.
In this case, a pair of supported portions 81 is provided separate from each other in the direction in which the pair of support claws 41 move, and the pair of support claws 41 are configured to be arranged between the pair of supported portions 81. The pair of support claws 41 are not limited to the sliding type, and may also be of a pivoting type in which the support claws 41 pivot around respective axes. In this case, the pair of support claws 41 may also be of a type of pivoting around respective horizontal axes, or a type of pivoting around respective vertical axes, or other types of pivoting around respective axes that tilt relative to the horizontal direction or vertical direction.

(3) The above embodiment has described an example in which the reference weight W0 is a detection value that is detected by the weight detecting portions 6S when the transportation-target object 8 is in a stationary state. However, the present invention is not limited to this example. The reference weight W0 may be detected during constant speed-lowering of the lift 51. While the lift 51 is being lowered at a constant speed, the weight of the transportation-target object 8 does not change due to the inertia acting in the up-down direction. Accordingly, it is possible to detect the weight of the transportation-target object 8 itself without being affected by the inertia that acts on the transportation-target object 8. Furthermore, if the lift 51 is not in a state of being lifted or lowered, the reference weight W0 may be detected while the traveling portion 2 is traveling.

(4) The above embodiment has described an example in which, if the semiconductor substrate(s) 80T is detected by the weight detecting portions 6S, the traveling speed VR of the transportation-target object 8 at which the traveling portion 2 travels is made lower than in the case where no semiconductor substrate 80T is detected. However, the present invention is not limited to this example. The traveling speed VR of the transportation-target object 8 at which the traveling portion 2 travels may be adjusted based on the number of semiconductor substrates 80T detected by the weight detecting portions 6S. For example, the traveling speed VR of the transportation-target object 8 at which the traveling portion 2 travels may also be made lower the larger the number of semiconductor substrates 80T accommodated in the container 80.

(5) The above embodiment has described an example in which, if the semiconductor substrate(s) 80T is detected by the weight detecting portions 6S, the lifting/lowering speed VH at which the lifting/lowering portion 5 lifts and lowers the transportation-target object 8 is made lower than in the case where no semiconductor substrate 80T is detected. However, the present invention is not limited to this example. The lifting/lowering speed VH at which the lifting/lowering portion 5 lifts and lowers the transportation-target object 8 may also be adjusted based on the number of semiconductor substrates 80T detected by the weight detecting portions 6S. For example, the lifting/lowering speed VH at which the lifting/lowering portion 5 lifts and lowers the transportation-target object 8 may also be made lower the larger the number of semiconductor substrates 80T accommodated in the container 80.

(6) The above embodiment has described an example in which the supported portion 81 is provided on the upper face of the container 80. However, the present invention is not limited to this example. The supported portion 81 may also be provided in a side face of the container 80. The supported portion 81 may not be provided in the container 80. In this case, the supporting portion 4 may be configured to hold the container 80 from the sides thereof.

(7) The above embodiment has described an example in which the weight detecting portions 6S is provided in the supporting portion 4. However, the present invention is not limited to this example. The weight detecting portions 6S may also be provided above the supporting portion 4 in the transport vehicle 1. For example, the weight detecting portions 6S may also be provided between the lift 51 and the lifting/lowering belts 52. At this time, the weight detecting portions 6S will detect the weight of the transportation-target object 8, as well as the weight of members that are arranged below the weight detecting portions 6S, such as the lift 51 and the supporting portion 4. In this case, the weight obtained by excluding the weight of the members arranged below the weight detecting portions 6S, such as the lift 51 and the supporting portion 4, from the detected weight W is the weight of the transportation-target object 8. For example, information regarding the weight of these members may be stored in the storage portion ME in the individual control device HM.

(8) Note that a configuration disclosed in each of the above-described embodiments may be combined with a configuration disclosed in the other embodiments for application, provided there is no inconsistency. Regarding other configurations as well, the embodiments disclosed in this specification are merely examples in all aspects. Accordingly, various modifications may be made as appropriate without departing from the gist of the present disclosure.

3. Summary of the Above Embodiment
A summary of the above-described transport vehicle will be described below.

A transport vehicle for transporting a transportation-target object to a placement location that is provided at a lower position includes: a supporting portion configured to support the transportation-target object; a lifting/lowering portion configured to lift and lower the transportation-target object in a suspended state; and a weight detecting portion configured to detect a weight of the transportation-target object, wherein a lowering speed of the transportation-target object is increased after a detection value that is detected by the weight detecting portion while the transportation-target object is being lowered by the lifting/lowering portion in a state where the transportation-target object is supported by the supporting portion has become smaller than or equal to a first set value, and thereafter, the supporting of the transportation-target object by the supporting portion is canceled after the suspending of the transportation-target object by the lifting/lowering portion has been canceled.

With this configuration, the weight of the transportation-target object that is in the process of being lowered can be detected using the weight detecting portion. Here, since the weight detecting portion is included in the transport vehicle, in practice, the weight detecting portion detects the weight of the transportation-target object that is supported by the transport vehicle. That is to say, the weight detecting portion can detect a change in the weight of the transportation-target object when the lowering speed increases or decreases, or due to the transportation-target object coming into contact with the placement location, for example. Using this configuration, it can be determined that the transportation-target object has come into contact with the placement location, based on the detection value detected by the weight detecting portion being lower than the first set value. After the transportation-target object has come into contact with the placement location, a situation where the transportation-target object collides with the placement location does not occur even if the lowering speed of the transportation-target object is increased. For this reason, in this embodiment, the lowering speed of the transportation-target object is increased after the detection value detected by the weight detecting portion has become lower than or equal to the first set value. Thus, it is possible to shorten the time taken from when the transportation-target object comes into contact with the placement location until the transportation-target object is completely supported by the placement location and the suspending of the transportation-target object is canceled. That is to say, with this configuration, transport efficiency can be increased by performing speed control so as to address a variation in the timing at which a transportation-target object comes into contact with a placement location.

It is preferable that it is determined that the suspending of the transportation-target object by the lifting/lowering portion has been canceled, based on at least one of a condition that the detection value detected by the weight detecting portion is smaller than or equal to a second set value that is smaller than the first set value, and a condition that the transportation-target object has been lowered by a set amount that corresponds to a height from the transport vehicle to the placement location.

With this configuration, it is possible to determine, as a result of a preset condition being satisfied, that the suspending of the transportation-target object by the lifting/lowering portion has been canceled, i.e., that the entire load of the transportation-target object has transferred to the placement location. Here, if the detection value detected by the weight detecting portion being smaller than or equal to the second set value that is smaller than the first set value is the condition, reliable determination can be made based on the actual weight detected by the weight detecting portion.

Also, if the transportation-target object having been lowered by the set amount is the condition, determination can be made without relying only on the weight detecting portion.

If both conditions are used, more reliable determination can be made than in the case of using one of the above conditions.

It is preferable that the lifting/lowering portion can perform constant speed-lowering that is to lower the transportation-target object at a constant speed, and it is determined whether or not the detection value detected by the weight detecting portion is smaller than or equal to the first set value, during the constant speed-lowering of the transportation-target object.

If the transportation-target object accelerates or decelerates while lowering, the detection value of the weight of the transportation-target object will change due to the inertia generated during the acceleration or deceleration. In this regard, with this configuration, it is determined whether or not the detection value detected by the weight detecting portion is smaller than or equal to the first set value, during constant speed-lowering that does not cause a change in the detection value of the weight of the transportation-target object. Accordingly, the accuracy of this determination can be ensured.

It is preferable that the first set value is a value that is smaller than a reference weight of the transportation-target object at a set ratio, and the reference weight is a detection value that is detected by the weight detecting portion when the transportation-target object is in a stationary state.

With this configuration, the reference weight is detected by the weight detecting portion when the transportation-target object is in a stationary state. Accordingly, it is possible to detect the weight of the transportation-target object itself without being affected by the inertia that acts on the transportation-target object. Since the first set value is a value that is smaller than this reference weight at a set ratio, it can be determined that the transportation-target object is lighter than the reference weight when the detection value detected by the weight detecting portion is smaller than or equal to the first set value. It is thus possible to determine that the load transfer starting state has been entered.

It is preferable that the transportation-target object includes a semiconductor substrate and a container for accommodating the semiconductor substrate, at least presence of the semiconductor substrate accommodated in the container is detected by the weight detecting portion, and if the semiconductor substrate is detected by the weight detecting portion, a lifting/lowering speed at which the lifting/lowering portion lifts and lowers the transportation-target object is made lower than in a case where the semiconductor substrate is not detected.

The vibration occurring during lifting and lowering is likely to be larger the higher the lifting/lowering speed of the transportation-target object, and the vibration is likely to be smaller the lower the lifting/lowering speed. In this embodiment, if the transportation-target object is a semiconductor substrate and a container for accommodating this semiconductor substrate, at least the presence of the semiconductor substrate in the container can be detected using the weight detecting portion. If it is detected that the semiconductor substrate is present in the container, the lifting/lowering speed of the transportation-target object is made lower than in the case where a semiconductor substrate is not detected. Thus, the vibration occurring while the transportation-target object is being lifted or lowered can be reduced. Accordingly, with this configuration, damage to the semiconductor substrate due to the vibration occurring while the transportation-target object is being lifted or lowered can be suppressed.

It is preferable that the transport vehicle further includes a traveling portion configured to travel along a transport path that is provided along a ceiling face, wherein the transportation-target object includes a semiconductor substrate and a container for accommodating the semiconductor substrate, at least presence of the semiconductor substrate accommodated in the container is detected by the weight detecting portion, and if the semiconductor substrate is detected by the weight detecting portion, a traveling speed at which the transportation-target object is made to travel by the traveling portion is made lower than in a case where the semiconductor substrate is not detected.

The vibration occurring during traveling is likely to be larger the higher the traveling speed of the traveling portion, and the vibration is likely to be smaller the lower the traveling speed. In this embodiment, if the transportation-target object is a semiconductor substrate and a container for accommodating this semiconductor substrate, at least the presence of the semiconductor substrate in the container can be detected using the weight detecting portion. If it is detected that the semiconductor substrate is present in the container, the traveling speed of the traveling portion is made lower than in the case where the semiconductor substrate is not detected. Thus, the vibration occurring when the traveling portion is traveling can be reduced. Accordingly, with this configuration, damage to the semiconductor substrate due to the vibration occurring while the traveling portion is traveling can be suppressed.

INDUSTRIAL APPLICABILITY

The technique according to the present disclosure is available for a transport vehicle that includes a lifting/lowering portion for lifting and lowering a transportation-target object.

What is claimed is:

1. A transport vehicle for transporting a transportation-target object to a placement location that is provided at a lower position, comprising:
a supporting portion configured to support the transportation-target object;
a lifting/lowering portion configured to lift and lower the transportation-target object in a suspended state;
a weight detecting portion configured to detect a weight of the transportation-target object; and
a control device configured to receive information from the supporting portion, the lifting/lowering portion, and the weight detecting portion and configured to control the supporting portion, the lifting/lowering portion, and the weight detecting portion,
wherein the control device increases a lowering speed of the transportation-target object after a detection value is detected by the weight detecting portion and communicated to the control device while the transportation-target object is being lowered by the lifting/lowering portion, in a state where the transportation-target object is supported by the supporting portion has become smaller than or equal to a first set value and, thereafter, the supporting of the transportation-target object by the supporting portion is canceled by the control device after the suspending of the transportation-target object by the lifting/lowering portion has been canceled by the control device.

2. The transport vehicle according to claim 1, wherein the control device determines the suspending of the transportation-target object by the lifting/lowering portion is canceled, based on at least one of a condition that the detection value detected by the weight detecting portion is smaller than or equal to a second set value that is smaller than the first set value and a condition that the transportation-target object has been lowered by a set amount that corresponds to a height from the transport vehicle to the placement location.

3. The transport vehicle according to claim 1, wherein the lifting/lowering portion is configured to perform constant speed-lowering to lower the transportation-target object at a constant speed, and
wherein the control device determines whether or not the detection value detected by the weight detecting portion is smaller than or equal to the first set value during the constant speed-lowering of the transportation-target object.

4. The transport vehicle according to claim 1, wherein the first set value is a value that is smaller than a reference weight of the transportation-target object at a set ratio, and
wherein the reference weight is a detection value that is detected by the weight detecting portion when the transportation-target object is in a stationary state.

5. The transport vehicle according to claim 1, wherein:
the transportation-target object includes a semiconductor substrate and a container for accommodating the semiconductor substrate,
at least presence of the semiconductor substrate accommodated in the container is detected by the weight detecting portion, and
if the semiconductor substrate is detected by the weight detecting portion, a lifting/lowering speed at which the lifting/lowering portion lifts and lowers the transportation-target object is reduced by the control device to a speed lower than in a case where the semiconductor substrate is not detected.

6. The transport vehicle according to claim 1, further comprising:
a traveling portion configured to travel along a transport path that is provided along a ceiling face,
wherein the transportation-target object includes a semiconductor substrate and a container for accommodating the semiconductor substrate,
wherein at least presence of the semiconductor substrate accommodated in the container is detected by the weight detecting portion, and
wherein if the semiconductor substrate is detected by the weight detecting portion, a traveling speed at which the transportation-target object is made to travel by the traveling portion is reduced by the control device to a speed lower than in a case where the semiconductor substrate is not detected.

* * * * *

UNITED STATES PATENT AND TRADEMARK OFFICE
CERTIFICATE OF CORRECTION

PATENT NO. : 10,347,518 B2
APPLICATION NO. : 15/794046
DATED : July 9, 2019
INVENTOR(S) : Ryuya Murakami It is certified that error appears in the above-identified patent and that said Letters Patent is hereby corrected as shown below:

In the Claims

Column 22, Line 9, Claim 2, delete "canceled," and insert -- canceled --

Signed and Sealed this
Twenty-fourth Day of September, 2019

Andrei Iancu
*Director of the United States Patent and Trademark Office*